United States Patent [19]

Chung et al.

[11] Patent Number: 4,585,958
[45] Date of Patent: Apr. 29, 1986

[54] IC CHIP WITH NOISE SUPPRESSION CIRCUIT

[75] Inventors: Michael S. Chung, Bridgewater; Masakazu Shoji, Warren, both of N.J.

[73] Assignee: AT&T Bell Laboratories, Murray Hill, N.J.

[21] Appl. No.: 567,367

[22] Filed: Dec. 30, 1983

[51] Int. Cl.[4] .................. H03K 19/092; H03K 19/096
[52] U.S. Cl. .................... 307/473; 307/443; 307/446; 307/475; 307/481
[58] Field of Search ............... 307/200 A, 200 B, 443, 307/446, 453, 473, 481, 542, 544, 549, 550, 557, 558, 240, 246, 570, 577, 579, 264, 265, 296 R, 475

[56] References Cited

U.S. PATENT DOCUMENTS

| | | | |
|---|---|---|---|
| 3,912,947 | 10/1975 | Buchanan | 307/473 X |
| 4,027,294 | 5/1977 | Meusburger et al. | 307/200 B X |
| 4,042,833 | 8/1977 | Lesser | 307/200 B |
| 4,398,106 | 8/1983 | Davidson et al. | 307/200 A X |
| 4,414,480 | 11/1983 | Zasio | 333/32 X |
| 4,437,022 | 3/1984 | Miersch et al. | 307/542 X |
| 4,477,736 | 10/1984 | Onishi | 307/443 X |
| 4,488,066 | 12/1984 | Shoji | 307/443 X |

Primary Examiner—Stanley D. Miller
Assistant Examiner—D. R. Hudspeth
Attorney, Agent, or Firm—Caplan, David I.

[57] ABSTRACT

A microprocessor chip is adapted to maintain its databus at a reference voltage level during idle times between outputs. The arrangement enables like pull-up and pull-down delays as well as low noise levels to be achieved in the output circuits.

5 Claims, 8 Drawing Figures

IC CHIP WITH NOISE SUPPRESSION CIRCUIT

FIELD OF THE INVENTION

This invention relates to integrated circuit (IC) chips useful in data processing and more particularly to such chips for implementing microprocessors.

BACKGROUND OF THE INVENTION

Data processing apparatus, such as a microprocessor, usually includes one or more bus structures which serve as transmission lines for data or instructions between various parts of the microprocessor and between a microprocessor and external utilization and memory circuits. A microprocessor implemented in complementary metal-oxide-semiconductor (CMOS) technology usually introduces a considerable amount of noise on, for example, a databus which transmits outputs to such utilization circuits. Particulary if the utilization circuit is implemented in transistor-transistor logic (TTL), as is usually the case, that noise results in reduced throughput by forcing a lower clock frequency.

In the past, such noise has been overcome to some extent by the addition of extra power supply connections to the powerbus to distribute and thus reduce charge variations over a number of lines. But such a remedy still reduces throughput and requires an increased pin out configuration.

SUMMARY OF THE INVENTION

The problem of databus noise is alleviated by attaching to the databus a circuit operative to drive the databus to, for example, a reference voltage (i.e., approximately 1.5 volts—the threshold for TTL logic) from which voltage output signals vary relatively little during output phases. Consequently, relatively little noise is transmitted during the output phases. It has been realized that particularly TTL circuits cannot fully use the relatively high voltage levels (over 2.1 volts) previously provided by such CMOS circuits during output phases. It was found further that the reduction in voltage due to a reference-voltage restore operation between output phases does not reduce the useful voltages applied to the TTL circuits during an output phase.

DETAILED DESCRIPTION

Figure 1:
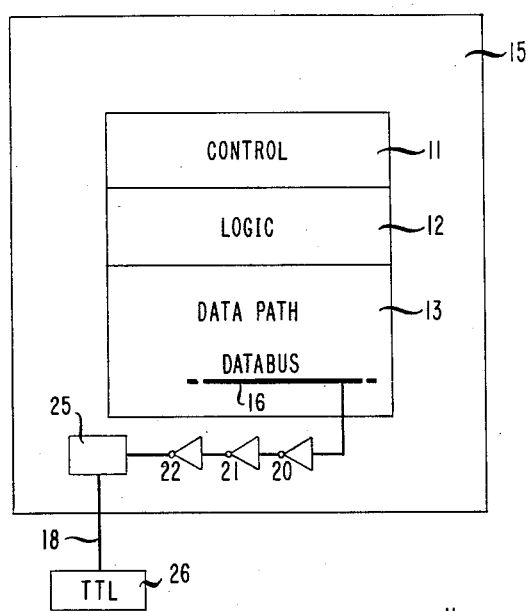
FIG. 1 is a block diagram of a prior art microprocessor along with a TTL utilization circuit.

FIG. 1 shows a schematic representation of a prior art semiconductor IC 10 in which a microprocessor is implemented. The microprocessor includes control, logic and datapath portions 11, 12, and 13. The various portions are encompassed by an I/O frame 15 in which output circuits buffer outputs between the microprocessor and external memory and utilization circuits. Signals are applied to the output circuits via a databus 16.

A typical output circuit includes a chain of inverting amplifiers shown in FIG. 1 as amplifiers 20, 21, and 22. The output of the amplifier chain is connected to a pad 25 which is available for external connection to, for example, a TTL (transistor-transistor logic) circuit 26 via an external databus 18. Such an output circuit is present for each bit in the databus. Thus, for a sixteen bit databus, sixteen output circuits are present, each connected to an external databus.

Figure 2:
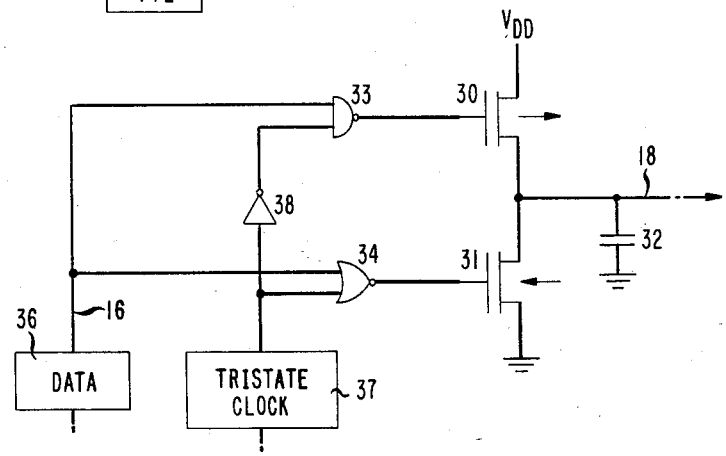
FIG. 2 is a circuit diagram of a prior art circuit useful in the arrangement of FIG. 1.

FIG. 2 shows a circuit schematic of a prior art amplifier for the amplifier chain. The amplifier comprises p- and n-type field effect transistors (P and NFETS of the enhancement mode type) 30 and 31 with drains connected (via a parasitic capacitance identified at 32) to ground, as shown. The transistors are connected between $V_{DD}$ (supply voltage) and ground. Data and clock signals are applied to the gate electrodes by an input network comprising NAND circuit 33 and NOR circuit 34. Data and clock inputs are applied to each of circuits 33 and 34 during normal operation by data and clock sources 36 and 37, respectively, the clock input to circuit 33 being applied via inverter 38.

The input network (33+34) is operative to drive the gate of transistor 30 low when the data signal is high and the clock signal is low thus pulling the external databus (18) up to a relatively high output state of the two binary signal states which databus 18 can assume. When data and clock signals are both low, the gate of transistor 31 is driven high and pull down of the external databus to the relatively low output state occurs. When the data signal is low or high and the clock signal is high, transistors 30 and 31 are nonconducting. In this latter instance also, the gate of transistor 31 is low and the gate of 30 is high.

Figure 3:
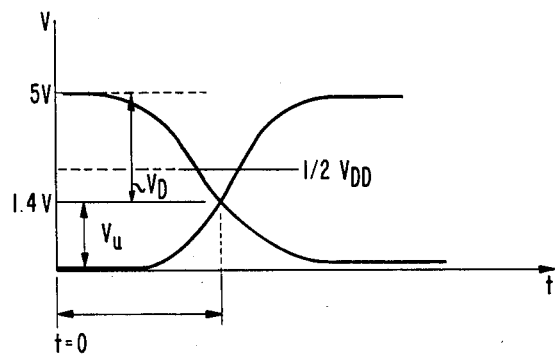
FIG. 3 is a pulse diagram of the outputs of the circuit of the type shown in FIG. 2.

The amplifier provides an output signal represented in the voltage versus time pulse diagram of FIG. 3. Note that $\frac{1}{2}V_{DD}$ (2.5 volts) is not the switching point and that the pull-down voltage (arrow $V_D$) is greater than the pull-up (arrow $V_u$) voltage. Pull-up and pull-down delays can be made equal if the NFET is made much stronger than the PFET; but the pull-down noise which is associated with the pull-down voltage ($V_D$) in this instance would be unacceptable due to large changes in charge on the external databus.

Figure 4:
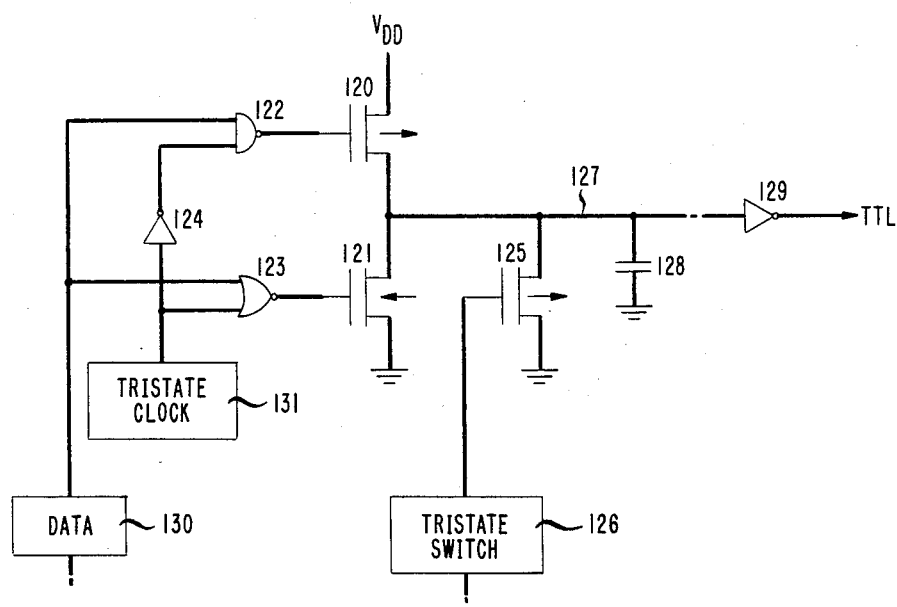
FIGS. 4 and 7 are circuit diagrams of circuits of a type useful in the arrangement of FIG. 1 including reference-voltage level restore circuits for reducing noise during output phases of operation in accordance with the principles of the present invention.

One arrangement in accordance with the principles of this invention which provides equal pull-up and pull-down delays and has acceptable noise characteristics is shown in FIG. 4. FIG. 4 shows PFET and NFET 120 and 121 connected electrically in series between a supply voltage $V_{DD}$ and ground.

Data and control signals are applied to the gate electrodes of the transistors via an input network analogous to that shown in FIG. 2. The input network comprises NAND circuit 122 and NOR circuit 123, the outputs of which are connected to the gates of transistors 120 and 121 respectively. Data and clock signals are applied to inputs to cicuits 122 and 123, the clock signal being applied to an input of circuit 122 via inverter 124. The clock source enables tristate, on (high and low) and off operation, of the output driver comprising transistors 120 and 121.

The drains of transistors 120 and 121 are connected to the source of PFET 125 (the bus precharger). The drain of transistor 125 is connected to ground (any suitable reference potential). The gate of transistor 125 is connected to a tristate switch 126 operating as the databus controller. The source of PFET 125 is connected via synchronous bus 127 (the external databus) to ground via parasitic bus capacitance 128 for system data distribution. The source of PFET 125 also is connected to the input of receiver 129. Receiver 129 is shown as a single inverter in FIG. 4, but may be taken to represent many inverters as is usually the case. Databus 127 in the embodiment of FIG. 4 thus can be seen to correspond to external databus 18 of FIG. 1. The data and clock sources are represented by blocks 130 and 131.

Figure 5:
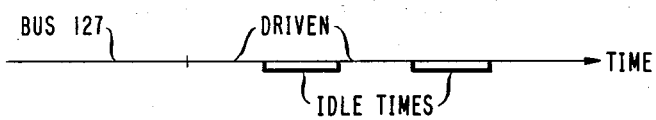
FIG. 5 is a timing diagram of the operation of the circuit of FIG. 4.

The circuit of FIG. 4 is operative so that the source of PFET 125 floats electrically in a manner such that any downward change in charge is referenced to a floating point. That point is chosen to be about 1.4 or 1.5 volts and is maintained on databus 127 during idle times between clock pulses applied to 122 in FIG. 4. The timing for the idle times and driven times for the bus are depicted in FIG. 5.

Figure 6:
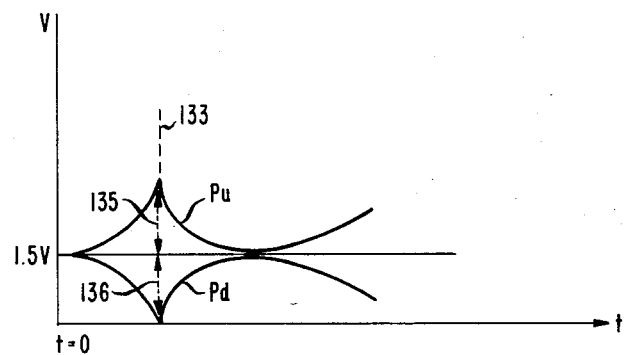
FIG. 6 is a pulse diagram of the outputs of circuits of the type shown in FIGS. 4 and 7.

The output characteristic of the circuit of FIG. 4 is shown in FIG. 6. The pull-up and pull-down curves Pu and Pd, respectively, can be seen to provide equal delays (broken line 133) and equal amounts of charge variation (arrows 135 and 136). It is clear that acceptable noise levels are achieved along with equal delay.

Figure 7:
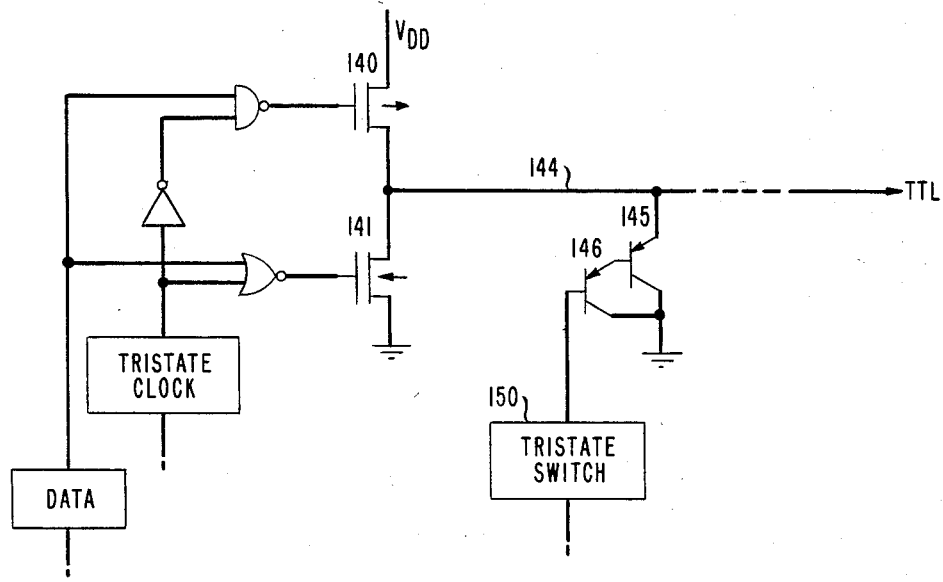

FIG. 7 is a circuit diagram of an arrangement analogous to that of FIG. 4 in organization and operation but implemented with bipolar junction transistors (BJT's). The arrangement is similar to that shown in FIG. 4 and has a clock input network comprising PFET and NFET 140 and 141. Clock pulses are applied to the gates of transistors 140 and 141 in the manner described in connection with FIG. 4.

The bus precharging circuit in this embodiment comprises bipolar junction transistors 145 and 146. The emitter of BJT 145 is connected to databus 144 and the collector is connected to ground. The base of BJT 145 is connected to the emitter of BJT 146. The collector of BJT 146 is connected to ground. The base of BJT 146 is connected to tristatable switch 150, the databus controller. Operation is entirely as depicted in FIGS. 5 and 6 with a base-emitter voltage drop of about 1.4 volts appearing across BJT's 145 and 146. The arrangement not only provides the desired float but, importantly, is temperature insensitive and is compatible with P substrate complementary-metal-oxide-semiconductor (CMOS) technology.

Figure 8:
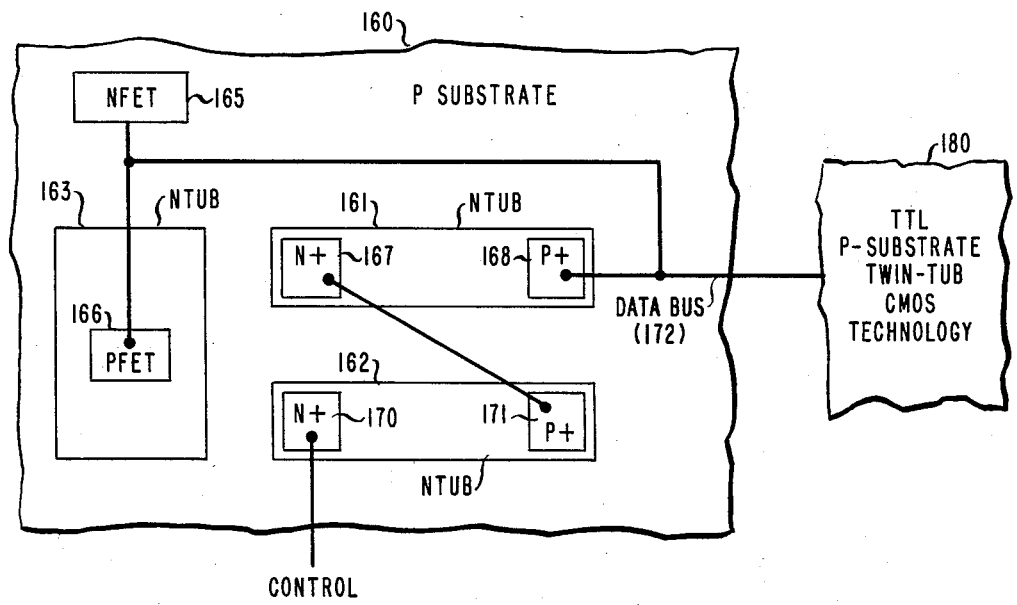
FIG. 8 is an enlarged schematic top view of an implementation of the circuit of FIG. 7.

FIG. 8 is an enlarged schematic top view of a semiconductor chip fragment in which the circuit of FIG. 7 is implemented. A p-type substrate 160 is assumed. Three n-type tubs 161, 162, 163 are formed using well-known photolithographic and diffusion techniques. NFET 165 (140 of FIG. 7) is formed in the p-type substrate and PFET 166 (141 of FIG. 7) is formed in NTUB 163. The BJT's (145 and 146 of FIG. 7) are defined in NTUBS 161 and 162, respectively, by N+ and P+ regions 167 and 168 and by N+ and P+ regions 170 and 171, respectively. The P+ region 168 is the emitter and is connected to the databus 172 (144 of FIG. 7). The implementation will be recognized by one skilled in the art to be compatible with TTL, p-subtrate twin-tub CMOS technology as indicated at 180 in FIG. 8.

What is claimed is:
1. In combination
 (a) a utilization means;
 (b) a semiconductor integrated circuit chip including a data path for generating binary data signals and an internal databus connected to the data path for receiving the binary signals generated by the data path;
 (c) an external databus connected for transmitting the binary signals from the internal databus to the utilization means;
 (d) clock means for producing a clock sequence of alternating driven and idle phases;
 (e) amplifier means, connected for receiving the binary signals from the internal databus and responsive to the clock sequence of alternating driven and idle phases, for restoring the binary signals to prescribed high and low signal levels in accordance with the binary signals, and connected to the external databus for delivering thereto during each of the driven phases the thus restored binary signals and for floating the external databus during each of the idle phases; and
 (f) first means for reducing the voltages of the external databus from the high level toward a prescribed intermediate voltage level, which lies between said high and low levels, during each of the idle phases and for floating the external databus during each of the driven phases.

2. An IC chip in accordance with claim 1 wherein said first means includes a tristate switch for controlling said external databus, and switching means referenced to the prescribed intermediate voltage level, connected to said external databus, and responsive to a signal fron said tristate switch to reduce the voltage level on said databus toward said intermediate level during each of said idle phases.

3. An IC chip in accordance with claim 2 wherein said switching means comprises first and second bipolar junction transistors (BJT).

4. An IC chip in accordance with claim 3 wherein the emitter, base, and collector of said first BJT are connected to said external databus, to the emitter of said second BJT and to a reference potential, respectively.

5. An IC chip in accordance with claim 4 wherein the base and collector of said second BJT are connected to said tristate switch and to said reference potential respectively.

* * * * *